United States Patent
Lee et al.

(10) Patent No.: US 10,041,991 B2
(45) Date of Patent: Aug. 7, 2018

(54) BOARD INSPECTION APPARATUS SYSTEM AND BOARD INSPECTION METHOD

(71) Applicant: KOH YOUNG TECHNOLOGY INC., Seoul (KR)

(72) Inventors: Seung-Jun Lee, Seoul (KR); Moon-Young Jeon, Seoul (KR); Nam Ho Lee, Uijeongbu-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 580 days.

(21) Appl. No.: 14/072,178

(22) Filed: Nov. 5, 2013

(65) Prior Publication Data
US 2014/0125375 A1    May 8, 2014

(30) Foreign Application Priority Data

Nov. 6, 2012 (KR) .................. 10-2012-0124833
May 31, 2013 (KR) .................. 10-2013-0062871

(51) Int. Cl.
*G01R 31/28* (2006.01)
*G05B 19/418* (2006.01)
*H05K 13/08* (2006.01)

(52) U.S. Cl.
CPC ... *G01R 31/2805* (2013.01); *G05B 19/41875* (2013.01); *H05K 13/08* (2013.01)

(58) Field of Classification Search
CPC ........................ G01R 31/2805; H05K 13/08
(Continued)

(56) References Cited

U.S. PATENT DOCUMENTS 7,181,058 B2 *  2/2007  Weisgerber ............ H05K 13/08
                                                    250/559.34
2003/0018631 A1 *  1/2003  Lipson ............. G06F 17/30247
(Continued)

FOREIGN PATENT DOCUMENTS

CN          1932491          3/2007
CN        101122569          2/2008
(Continued)

OTHER PUBLICATIONS

Tomoyasu, Kazuhiko et al., translation of JP 2004-355521 A.*
Shimizu, Atsushi et al., translation of JP 2006-216589 A.*

*Primary Examiner* — Patrick Assouad
*Assistant Examiner* — Khristopher Yodchikas
(74) *Attorney, Agent, or Firm* — Kile Park Reed & Houtteman PLLC

(57) ABSTRACT

A board inspection apparatus system includes a first apparatus, a second apparatus, a third apparatus and an information transfer section. The first apparatus acquires first three-dimensional information of a solder paste on a board, and inspects whether the solder paste is formed good by a first tolerance based on the first three-dimensional information. The second apparatus mounts an electronic component on the board to join the electronic component and the solder paste. The third apparatus acquires second three-dimensional information of a solder joint, and inspects whether the electronic component is mounted good by a second tolerance based on the second three-dimensional information. The information transfer section transfers the first three-dimensional information to the third apparatus, or transfers the second three-dimensional information to the first apparatus. Thus, a more effective inspection condition may be established, and a rate of defect for each apparatus may be greatly reduced.

5 Claims, 7 Drawing Sheets

(58) Field of Classification Search
USPC .............................. 324/763.01; 382/140–149
See application file for complete search history.

(56) References Cited

U.S. PATENT DOCUMENTS

| | | | |
|---|---|---|---|
| 2006/0271226 A1 | 11/2006 | Tasaki et al. | |
| 2008/0166039 A1* | 7/2008 | Tateyama | H05K 13/08 382/150 |
| 2010/0007896 A1* | 1/2010 | Fishbaine | G01N 21/8806 356/603 |
| 2010/0021050 A1* | 1/2010 | Kakuda | B23K 1/0016 382/150 |

FOREIGN PATENT DOCUMENTS

| | | |
|---|---|---|
| CN | 102608114 | 7/2012 |
| DE | 299 16 075 | 1/2001 |
| JP | 3-29807 | 2/1991 |
| JP | 4-55709 | 2/1992 |
| JP | 2000-275028 | 10/2000 |
| JP | 2002-134899 | 5/2002 |
| JP | 2004-355521 | 12/2004 |
| JP | 2004355521 A * | 12/2004 |
| JP | 2005-347387 | 12/2005 |
| JP | 2006-216589 | 8/2006 |
| JP | 2006216589 A * | 8/2006 |
| JP | 2006-237236 | 9/2006 |
| JP | 2006-324424 | 11/2006 |
| JP | 2008-153342 | 7/2008 |
| JP | 2008-166403 | 7/2008 |
| JP | 4372719 | 9/2009 |
| JP | 2012-145484 | 8/2012 |
| KR | 1998-073992 | 11/1998 |
| KR | 10-2011-0063966 | 6/2011 |
| TW | 201231960 | 8/2012 |
| WO | 2007/119869 | 10/2007 |
| WO | 2012/096004 | 7/2012 |

* cited by examiner

BOARD INSPECTION APPARATUS SYSTEM AND BOARD INSPECTION METHOD

CROSS REFERENCE TO RELATED APPLICATION

This application claims priority from and the benefit of Korean Patent Applications No. 10-2012-0124833 filed on Nov. 6, 2012 and No. 10-2013-0062871 filed on May 31, 2013, which are hereby incorporated by reference for all purposes as if fully set forth herein.

BACKGROUND OF THE INVENTION

Field of the Invention

Exemplary embodiments of the present invention relate to a board inspection apparatus system and a board inspection method. More particularly, exemplary embodiments of the present invention relate to a board inspection apparatus system and a board inspection method capable of establishing effective inspection conditions.

Discussion of the Background

Generally, at least one printed circuit board (PCB) is employed in an electronic device, and various circuit elements such as a circuit pattern, a connection pad part, a driver chip electrically connected to the connection pad part, etc. are mounted on the PCB.

Generally, a component assembly board, in which electronic components are mounted on a PCB, is widely employed in various electronic goods. The component assembly board is manufactured by such a method that a solder paste is formed on a pad region of a bare board and thereafter terminals of the electronic component is coupled to a region on which the solder paste is formed.

Before mounting an electronic component on a PCB, a solder paste inspection (SPI) process may be performed, where it is inspected that solder is formed good on a pad region of the PCB. In addition, after mounting the electronic component on the PCB, an automated optical inspection (AOI) process may be performed, where various types of defects, i.e., whether the electronic component is formed good on a pad region of the PCB, are inspected.

Conventionally, the SPI process has been performed mostly by measuring a three-dimensional shape, and the AOI process has been performed mostly by measuring a two-dimensional shape. In addition, the two inspection processes have been independently performed.

SUMMARY OF THE INVENTION

Conventionally, since the SPI process has been performed mostly by measuring a three-dimensional shape, and the AOI process has been performed mostly by measuring a two-dimensional shape, it is difficult that result of one inspection is applied to the other inspection. However, when result of one inspection is used to the other inspection, it may be advantageous to establish a more effective inspection condition.

Thus, exemplary embodiments of the present invention provide a board inspection apparatus system and a board inspection method capable of establishing an effective inspection condition.

Additional features of the invention will be set forth in the description which follows, and in part will be apparent from the description, or may be learned by practice of the invention.

An exemplary embodiment of the present invention discloses a board inspection apparatus system. The board inspection apparatus system includes a first apparatus, a second apparatus, a third apparatus and an information transfer section. The first apparatus acquires first three-dimensional information of a solder paste formed on a board, and inspects whether the solder paste is formed good or bad by a predetermined first tolerance based on the first three-dimensional information. The second apparatus mounts an electronic component on the board having the solder paste formed thereon to join the electronic component and the solder paste with each other. The third apparatus acquires second three-dimensional information of a solder joint that corresponds to the solder paste joining the electronic component, and inspects whether the electronic component is mounted good or bad by a predetermined second tolerance based on the second three-dimensional information. The information transfer section transfers the first three-dimensional information of the solder paste to the third apparatus, or transfers the second three-dimensional information of the solder joint to the first apparatus.

In an exemplary embodiment, the second three-dimensional information of the solder is joint may include shape information of the solder joint, and the first apparatus may modify the first tolerance by using the shape information of the solder joint, which is transferred from the information transfer section. For example, in case that volume information of the solder paste is included in the first tolerance and a curvature extracted from the shape of the solder joint is not included in the second tolerance, the first tolerance may be modified narrower by a predetermined value. For example, in case that a curvature extracted from the shape of the solder joint is included in the second tolerance, the first tolerance may be modified wider by a predetermined value.

In an exemplary embodiment, the first three-dimensional information of the solder paste may include volume information of the solder paste, and the third apparatus may modify the second tolerance by using the volume information of the solder paste, which is transferred from the information transfer section.

The information transfer section may be formed at least one of the first apparatus and the third apparatus.

Another exemplary embodiment of the present invention discloses a board inspection apparatus system. The board inspection apparatus system includes a first apparatus, a second apparatus, a third apparatus and an information transfer section. The first apparatus acquires first three-dimensional information of a solder paste formed on a board, and inspects whether the solder paste is formed good or bad by a predetermined first tolerance based on the first three-dimensional information. The second apparatus mounts an electronic component on the board having the solder paste formed thereon to join the electronic component and the solder paste with each other. The third apparatus acquires second three-dimensional information of a solder joint is that corresponds to the solder paste joining the electronic component, and inspects whether the electronic component is mounted good or bad by a predetermined second tolerance based on the second three-dimensional information. The information transfer section transfers the first three-dimensional information of the solder paste to the third apparatus, or transfers the second three-dimensional information of the solder joint to the first apparatus. The first apparatus modifies the first tolerance by using the second three-dimensional information, which is transferred from the information transfer section, or the third apparatus modifies the second tolerance by using the first three-dimensional information, which is transferred from the information transfer section.

Still another exemplary embodiment of the present invention discloses a board inspection method. The board inspection method includes acquiring first three-dimensional information of a solder paste formed on a board, and inspecting whether the solder paste is formed good or bad by a predetermined first tolerance based on the first three-dimensional information, mounting an electronic component on the board having the solder paste formed thereon to join the electronic component and the solder paste with each other, acquiring second three-dimensional information of a solder joint that corresponds to the solder paste joining the electronic component, and inspecting whether the electronic component is mounted good or bad by a predetermined second tolerance based on the second three-dimensional information, and modifying at least one of the first tolerance and the second tolerance based on the first three-dimensional information of the solder paste and the second three-dimensional information of the solder joint.

Still another exemplary embodiment of the present invention discloses a board inspection apparatus system. The board inspection apparatus system includes a first apparatus, a is second apparatus, a database and an alarm-generating apparatus. The first apparatus acquires first three-dimensional information of a solder paste formed on a board, and inspecting whether the solder paste is formed good or bad by a predetermined first tolerance based on the first three-dimensional information. The second apparatus acquires second three-dimensional information for inspecting whether an electronic component that is mounted on the board having the solder paste formed thereon is mounted good or bad, and inspects whether the electronic component is mounted good or bad by a predetermined second tolerance based on the second three-dimensional information. The database stores the first three-dimensional information of the first apparatus and the second three-dimensional information of the second apparatus. The alarm-generating apparatus receives the first three-dimensional information and the second three-dimensional information from the database, and generates an alarm message to modify the first tolerance in case that the second three-dimensional information is beyond the second tolerance.

In an exemplary embodiment, the first three-dimensional information may include volume information of the solder paste, and the second three-dimensional information may include score information of a solder joint quantifying joint degree between the solder paste and the electronic component. The alarm-generating apparatus receives the volume information of the solder paste and the score information of the solder joint from the database, and generates the alarm message to modify the first tolerance in case that the score information of the solder joint is beyond the second tolerance.

In an exemplary embodiment, the solder paste may be formed at least two places corresponding to the electronic component. The first three-dimensional information may include volume difference information representing a difference between volumes of the solder paste at is the two places, and the second three-dimensional information may include co-planarity information representing a degree by which the electronic component is inclined to horizontality. The alarm-generating apparatus receives the volume difference information and the co-planarity information from the database, and generates the alarm message to modify the first tolerance in case that the co-planarity information is beyond the second tolerance.

The second apparatus may acquire third three-dimensional information for inspecting whether the electronic component is disposed good or bad after the electronic component is disposed on the board and before a reflow process, and inspect whether the electronic component is mounted good or bad by a predetermined third tolerance based on the third three-dimensional information. The database may store the third three-dimensional information. The alarm-generating apparatus may receive the second three-dimensional information and the third three-dimensional information from the database, and generate an alarm message to modify the third tolerance in case that the second three-dimensional information is beyond the second tolerance.

Still another exemplary embodiment of the present invention discloses a board inspection apparatus system. The board inspection apparatus system includes an SPI apparatus, a first AOI, a second AOI, a database and an alarm-generating apparatus. The SPI apparatus acquires first three-dimensional information of a solder paste formed on a board, and inspects whether the solder paste is formed good or bad by a predetermined first tolerance based on the first three-dimensional information. The first AOI apparatus acquires second three-dimensional information for mounting state of an electronic component after a reflow process, and inspects whether the electronic component is mounted good or bad by a predetermined second tolerance based on the second three-dimensional information. The second AOI apparatus acquires third is three-dimensional information for mounting state of the electronic component before the reflow process, and inspects whether the electronic component is mounted good or bad by a predetermined third tolerance based on the third three-dimensional information. The database stores the first three-dimensional information of the SPI apparatus and the second and third three-dimensional information of the first and second AOI apparatuses. The alarm-generating apparatus receives the first three-dimensional information, the second three-dimensional information and the third three-dimensional information from the database, and in case that one information of the first, second and third three-dimensional information is beyond the associated tolerance, generates an alarm message to modify at least one of the other tolerances.

In an exemplary embodiment, the alarm-generating apparatus may receive the first three-dimensional information and the third three-dimensional information from the database, and generate an alarm message to modify the first tolerance in case that the third three-dimensional information is beyond the third tolerance.

In an exemplary embodiment, the alarm-generating apparatus may receive the second three-dimensional information and the third three-dimensional information from the database, and generate an alarm message to modify the third tolerance in case that the second three-dimensional information is beyond the second tolerance.

In an exemplary embodiment, the first three-dimensional information may include offset information of the solder paste which represents a degree by which the solder paste deviates from a location at which the solder paste is prearranged to be formed, and the third three-dimensional information may include pre-offset information of the electronic component which is represents a degree by which the electronic component deviates from a location at which the electronic component is prearranged to be mounted after the electronic component is mounted and before reflow process is performed. The alarm-generating apparatus may receive the offset information and the pre-offset information from the database, and generate an alarm message to modify the first tolerance in case that the pre-offset information is beyond the third tolerance.

In an exemplary embodiment, the second three-dimensional information may include post-offset information of the electronic component which represents a degree by which the electronic component deviates from a location at which the electronic component is prearranged to be mounted after the reflow process is performed, and the third three-dimensional information may include pre-offset information of the electronic component which represents a degree by which the electronic component deviates from a location at which the electronic component is prearranged to be mounted after the electronic component is mounted and before the reflow process is performed. The alarm-generating apparatus may receive the pre-offset information and the post-offset information from the database, and generate an alarm message to modify the third tolerance in case that the post-offset information is beyond the second tolerance.

According to the board inspection apparatus system, three-dimensional information is acquired in each of an SPI apparatus and an AOI apparatus, and the acquired three-dimensional information is exchanged to each other, thereby sharing inspection results between the SPI apparatus and the AOI apparatus.

Particularly, three-dimensional information of a solder paste and three-dimensional information of a solder joint is acquired in the SPI apparatus and the AOI apparatus, respectively, and the acquired three-dimensional information is exchanged to each other, to use one inspection is result to another inspection, thereby modifying inspection condition of the two apparatuses effective.

In addition, three-dimensional measurement results of the SPI apparatus and the AOI apparatus are stored in a database, and an alarm-generating apparatus receives three-dimensional information from the database and in case that one inspection result is beyond a tolerance, generates an alarm message to another inspection, thereby automatically or manually modifying inspection condition more effective.

In other words, information of inspection result that is acquired in an SPI apparatus and an AOI apparatus is exchanged to each other through a linkage between the two apparatuses, and thus flexible control of narrowing or widening a tolerance with respect to defect, which is established in each apparatus, is performed, thereby greatly reducing various pseudo-errors (i.e., errors of judging a good board as a bad board) that may occur in SPI inspection and AOI inspection.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of is the invention.

DETAILED DESCRIPTION OF THE ILLUSTRATED EMBODIMENTS

Figure 1:
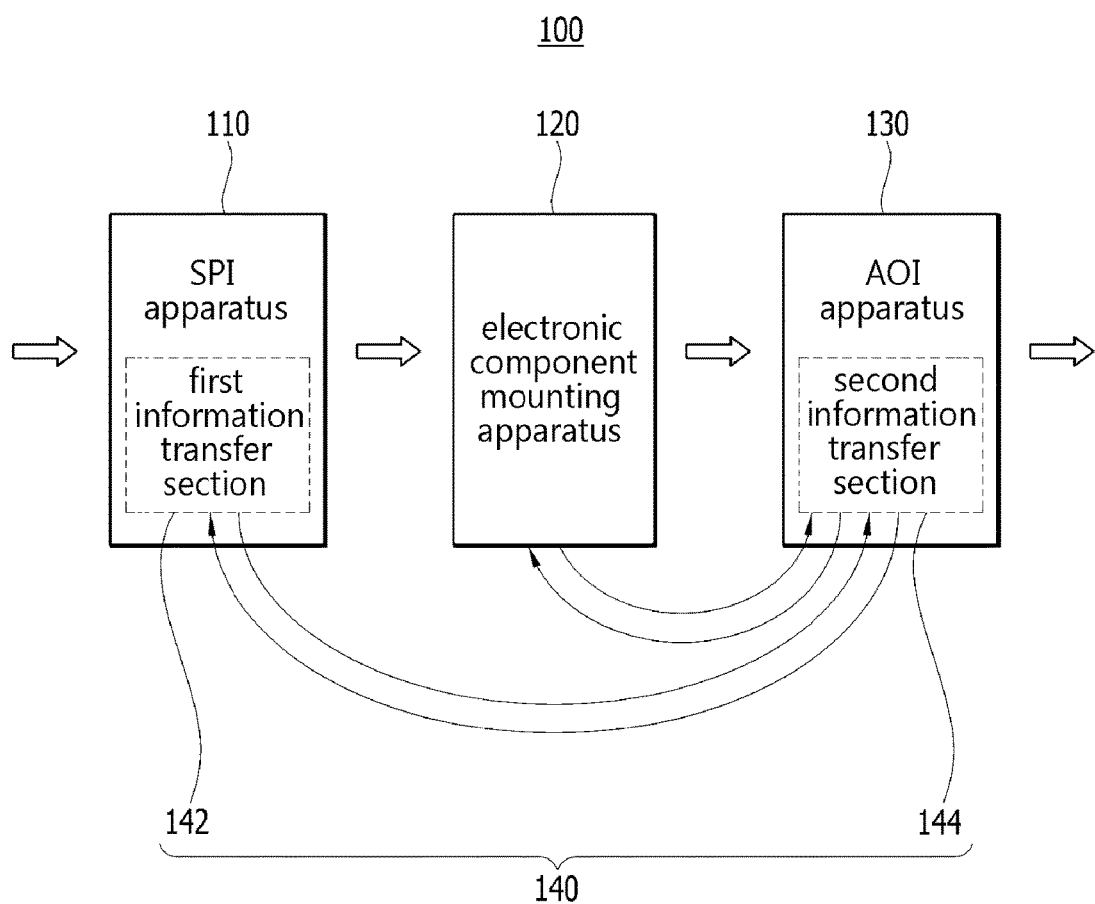
FIG. 1 is a block diagram illustrating a board inspection apparatus system according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example is embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the is figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described herein with reference to cross-sectional illustrations that are schematic illustrations of idealized example embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be described in detail with reference to the accompanying drawings.

FIG. 1 is a block diagram illustrating a board inspection apparatus system according to an exemplary embodiment of the present invention.

Referring to FIG. 1, a board inspection apparatus system 100 according to an exemplary embodiment of the present invention may include a solder paste inspection (hereinafter, referred to as "SPI") apparatus 110, an electronic component mounting apparatus 120, a reflow (not shown), an automated optical inspection (hereinafter, referred to as "AOI") apparatus 130, an information transfer section 140, etc.

The board inspection apparatus system 100 receives a board, for example, such as a printed circuit board (PCB), and inspects whether the board is good or bad. The board inspection apparatus system 100 performs a first inspection by inspecting whether a solder paste is formed good using the SPI apparatus 110, after receiving the board. Then, an electronic component is mounted on the board having the solder paste formed thereon by using the electronic component mounting apparatus 120, and thereafter the solder paste formed on the board is fused through a reflow process using, for example, a reflow equipment, to thereby form the electronic component on the board. Then, the board inspection apparatus system 100 performs a second inspection by inspecting whether the electronic component is formed good on the board using the AOI apparatus 130.

As described above, the AOI apparatus 130 typically inspects whether an electronic component, which is formed on a board after a reflow process, is formed good or bad, and may be disposed between the electronic component mounting apparatus 120 and the reflow, or may be disposed corresponding to the foregoing part and the following part of the reflow process.

A block arrow shown in FIG. 1 indicates a flow of the board via the SPI apparatus 110, the electronic component mounting apparatus 120 and the AOI apparatus 130.

Hereinafter, the board inspection apparatus system 100 will be described in detail.

The SPI apparatus 110 acquires first three-dimensional information of a solder paste formed on a board, and inspects whether the solder paste is formed good or bad by a first tolerance based on the first three-dimensional information.

In an exemplary embodiment, the SPI apparatus 110 measures a three-dimensional shape of the solder paste that is provided to form an external electronic component on a pad of the board, and acquires the first three-dimensional information. The first three-dimensional information may include, for example, a three-dimensional shape, a volume, a height, an area, a center of gravity, an eccentric amount, etc. of the solder paste, and the first three-dimensional information may also include two-dimensional information of the board and the solder paste.

For example, the first tolerance may correspond to a volume scope of the solder paste for judging an insufficient error, an excessive error and a cold error of the solder paste. Alternatively, the first tolerance may include a position scope for judging a position error of the solder paste, a bridge shape scope for judging a bridging error of the solder paste, etc.

The electronic component mounting apparatus 120 mounts the electronic component on the board having the solder paste formed thereon to join the electronic component and the solder paste with each other.

The AOI apparatus 130 acquires second three-dimensional information of a solder joint that corresponds to the solder paste joining the electronic component, and inspects whether the electronic component is mounted good or bad by a predetermined second tolerance based on the second three-dimensional information.

When the AOI apparatus 130 inspects whether the electronic component is mounted good or bad, the AOI apparatus 130 acquires three-dimensional information, and then inspects whether the electronic component is mounted good or bad by using the three-dimensional information. In an exemplary embodiment, the AOI apparatus 130 acquires the second three-dimensional information by measuring a three-dimensional shape of the electronic component mounted on the board and the solder joint. The second three-dimensional information may include, for example, three dimensional offset information of the electronic component, three-dimensional shape information and curvature information according to a position of the solder joint, etc., and the second three-dimensional information may also include two-dimensional information of the board and the electronic component.

For example, the second tolerance may correspond to an offset scope for judging whether a mounted position of the electronic component is good or bad, and correspond to a shape scope of the solder joint for judging lifted lead, solder fillet, etc. in the shape of the solder joint. In addition, the second tolerance may include a curvature scope according to the position of the solder joint.

The information transfer section 140 may transfer the first three-dimensional information of the solder paste to the AOI apparatus 130, or transfer the second three-dimensional information of the solder joint to the SPI apparatus 110.

The SPI apparatus 110 may modify the first tolerance by using the second three-dimensional information transferred from the information transfer section 140.

In an exemplary embodiment, the second three-dimensional information of the solder joint may include the shape information of the solder joint, and the SPI apparatus 110 may modify the first tolerance by using the shape information of the solder joint transferred from the information transfer section 140. In this case, the first tolerance may be modified according to the curvature information extracted from the shape of the solder joint. For example, when the first tolerance is set as a volume scope of the solder paste, since it is high probability that the solder paste is good although the volume of the solder paste is somewhat small, in case that the solder joint forms a preferable curvature, the volume scope corresponding to the first tolerance may be modified wider.

In other words, in view of a modification method, the first tolerance may be modified wider or narrower by a predetermined value, step by step, which may be automatically controlled in the SPI apparatus 110, or may be manually controlled by a user, by displaying modification scope information to the user.

In addition, the AOI apparatus 130 may modify the second tolerance by using the first three-dimensional information transferred from the information transfer section 140.

In an exemplary embodiment, the first three-dimensional information of the solder paste may include volume information of the solder paste, and the AOI apparatus 130 may modify the second tolerance by using the volume information of the solder paste transferred from the information transfer section 140. For example, in case that a desirable volume scope of the solder paste is pre-set and the volume information of the first three-dimensional information is within the pre-set volume scope, and there is no lifted lead error, since it is high probability that the shape of the solder joint is good although the shape of the solder joint somewhat deviates from normality, the second tolerance may be modified wider.

In other words, in view of a modification method, the second tolerance may be modified wider or narrower by a predetermined value, step by step, which may be automatically controlled in the AOI apparatus 130, or may be manually controlled by a user, by displaying modification scope information to the user.

In an exemplary embodiment, the information transfer section 140 may be formed at least one of the SPI apparatus 110 and the AOI apparatus 130. For example, the information transfer section 140 may include a first information transfer section 142 and a second information transfer section 144. The first information transfer section 142 may be formed at the SPI apparatus 110, and the second information transfer section 144 may be formed at the AOI apparatus 130. In this case, the first information transfer section 142 may be included in a central processing unit (CPU) or a control unit for driving the SPI apparatus 110, and the second information transfer section 144 may be included in a central processing unit or a control unit for driving the AOI apparatus 130.

A solid line arrow shown in FIG. 1 indicates a flow of information transfer signal that transfers the first three-dimensional information of the solder paste and the second three-dimensional information of the solder joint to each other between the SPI apparatus 110 and the AOI apparatus 130.

Alternatively, the information transfer section 140 may be an apparatus independent of the SPI apparatus 110 and the AOI apparatus 130.

An information transfer section (not shown), which is included in the SPI apparatus 110 and the AOI apparatus 130, may be also formed in the electronic component mounting apparatus 120. The information transfer section of the electronic component mounting apparatus 120 may include moving control information for each component, which is provided for mounting each electronic component, and may be included in a central processing unit or a control unit for driving the electronic component mounting apparatus 120.

Thus, when a board is transferred from the electronic component mounting apparatus 120, the AOI apparatus 130 may receive board information of the transferred board and moving control information for each component from the electronic component mounting apparatus 120, from the information transfer section of the electronic component mounting apparatus 120. In is other words, the AOI apparatus 130 may check what component is moved and mounted for each location on the board by a predetermined distance from the moving control information for each component. In case that a defect of location shift occurs based on a predetermined electronic component offset information and it is judged that the component moving control of the electronic component mounting apparatus 120 is necessary, a request message of the component moving control (the message may include moving control command) may be sent to the electronic component mounting apparatus 120.

Figure 2:
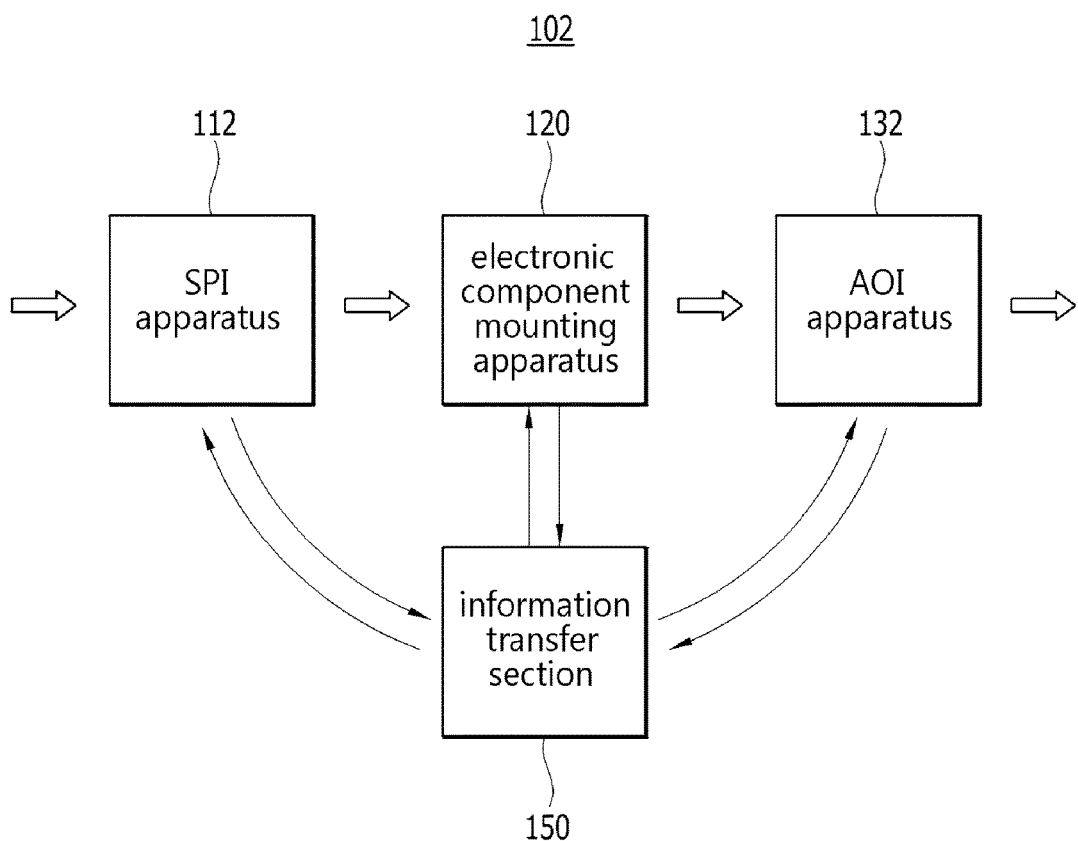
FIG. 2 is a block diagram illustrating a board inspection apparatus system according to another exemplary embodiment of the present invention.

FIG. 2 is a block diagram illustrating a board inspection apparatus system according to another exemplary embodiment of the present invention.

Referring to FIG. 2, a board inspection apparatus system 102 according to another exemplary embodiment of the present invention includes an SPI apparatus 112, an electronic component mounting apparatus 120, an AOI apparatus 132 and an information transfer section 150. The board inspection apparatus system 102 is substantially the same as the board inspection apparatus system 100 illustrated in FIG. 1 except that the information transfer section 150 is formed separate from the SPI apparatus, the electronic component mounting apparatus and the AOI apparatus. Thus, any further description will be omitted. The information transfer section 150 may be an apparatus independent of the SPI apparatus 112, the electronic component mounting apparatus 120 and the AOI apparatus 132. In this case, the information transfer section 150 may have a central processing unit or a control unit, which is independent of the SPI apparatus 112, the electronic component mounting apparatus 120 and the AOI apparatus 132, and may be separated from and combined with the SPI apparatus 112, the electronic component mounting apparatus 120 and the AOI apparatus 132.

The information transfer section 150 may include first and second tolerance information of each equipment, for example, such as the SPI apparatus 112, the electronic component mounting apparatus 120 and the AOI apparatus 132 and moving control information of components. The first and second tolerances and moving control information of components are modified for each predetermined step, and thereafter the modified information may be transferred to each equipment. Thus, a tolerance of detecting defect in each equipment may be integrally controlled by the information transfer section 150 without control of each equipment.

A solid line arrow shown in FIG. 2 indicates a flow of information transfer signal that transfers the first three-dimensional information of the solder paste and the second three-dimensional information of the solder joint to each other between the SPI apparatus 112 and the AOI apparatus 132.

Figure 3:
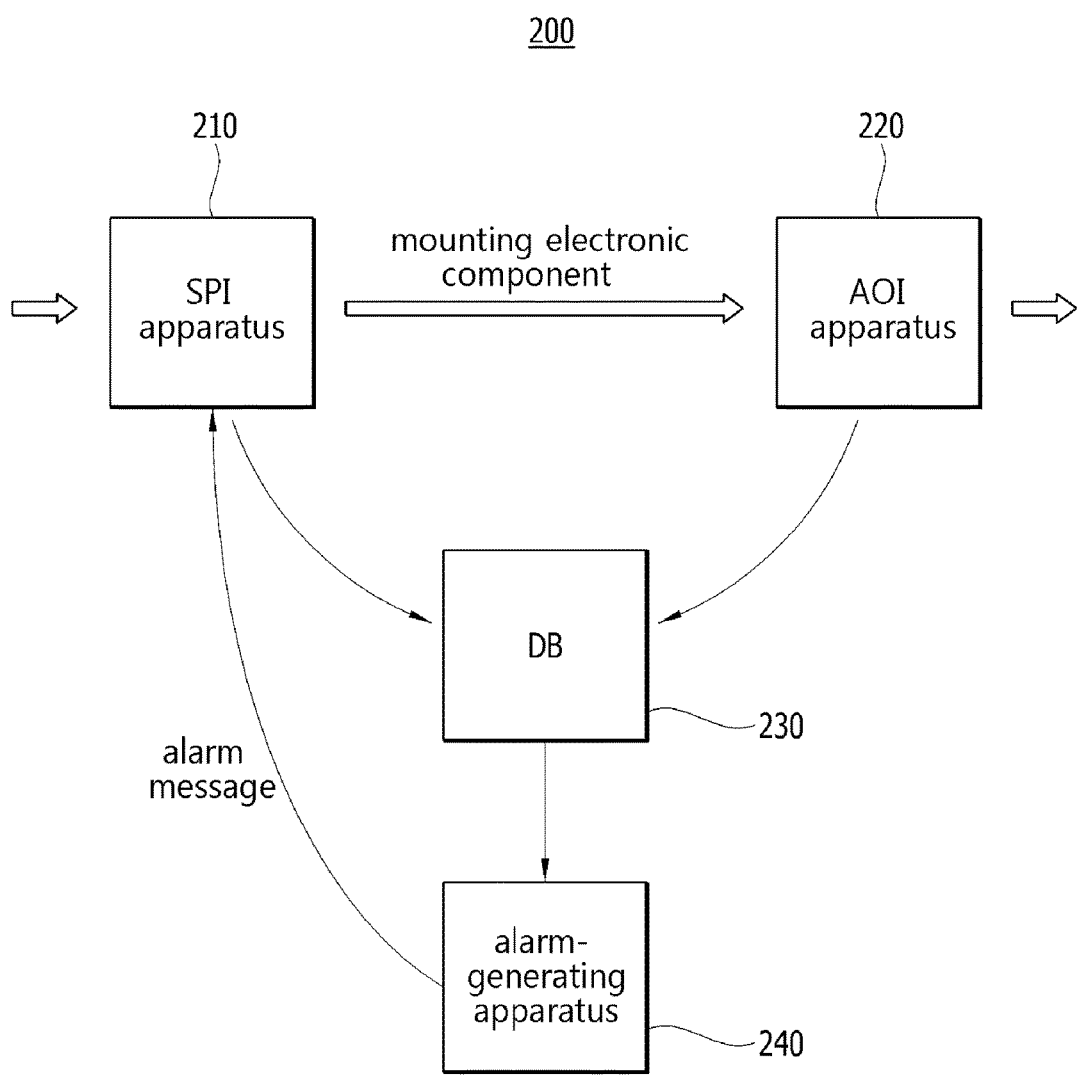
FIG. 3 is a block diagram illustrating a board inspection apparatus system according to still another exemplary embodiment of the present invention.

FIG. 3 is a block diagram illustrating a board inspection apparatus system according to still another exemplary embodiment of the present invention.

Referring to FIG. 3, a board inspection apparatus system 200 according to still another exemplary embodiment of the present invention includes an SPI apparatus 210, an AOI apparatus 220, a database 230, an alarm-generating apparatus 240, etc.

The board inspection apparatus system 200 receives a board, for example, such as a printed circuit board (PCB), and inspects whether the board is good or bad. The board inspection apparatus system 200 performs a first inspection by inspecting whether a solder paste is formed good using the SPI apparatus 210, after receiving the board. Then, an electronic component is mounted on the board having the solder paste formed thereon, and thereafter the solder paste is formed on the board is fused through a reflow process using, for example, a reflow equipment, to thereby form the electronic component on the board. Then, the board inspection apparatus system 200 performs a second inspection by inspecting whether the electronic component is formed good on the board using the AOI apparatus 220.

As described above, the AOI apparatus 220 typically inspects whether an electronic component, which is formed on a board after a reflow process, is formed good or bad.

A block arrow shown in FIG. 3 indicates a flow of the board via the SPI apparatus 210 and the AOI apparatus 220.

Hereinafter, the board inspection apparatus system 200 will be described in detail.

The SPI apparatus 210 acquires first three-dimensional information of a solder paste formed on a board, and inspects whether the solder paste is formed good or bad by a first tolerance based on the first three-dimensional information. The SPI apparatus 210 is substantially the same as the SPI apparatus 110 illustrated in FIGS. 1 and 2. Thus, any further description will be omitted.

The solder paste may be formed at least two places corresponding to the electronic component, and the first three-dimensional information may include volume difference information representing a difference between volumes of the solder paste at the two places.

After inspecting whether the solder paste is good or bad by using the SPI apparatus 210, the electronic component is mounted on the board having the solder paste formed thereon to join the electronic component and the solder paste with each other by using an equipment such as the electronic component mounting apparatus 120 described in FIGS. 1 and 2.

The AOI apparatus 220 acquires second three-dimensional information for inspecting is whether the electronic component, which is mounted on the board having the solder paste formed thereon, is mounted good or bad, and inspects whether the electronic component is mounted good or bad by a predetermined second tolerance based on the second three-dimensional information. The AOI apparatus 220 is substantially the same as the AOI apparatus 130 illustrated in FIGS. 1 and 2. Thus, any further description will be omitted.

The second three-dimensional information may include score information of a solder joint quantifying joint degree between the solder paste and the electronic component. The joint degree between the solder paste and the electronic component represents how much the lead of the electronic component is joined to the solder paste when the electronic component is mounted on the board having the solder paste formed thereon, and the joint degree is quantified to form a score of the solder joint.

In addition, the solder paste may be formed at least two places corresponding to the electronic component, and in this case, the second three-dimensional information may include co-planarity information representing a degree by which the electronic component is inclined to horizontality. The co-planarity information may include, for example, information of a height difference between both ends of the electronic component, information of a slope at the upper face of the electronic component, etc., and thus comparison of the slope information for each of the identical electronic components may be performed.

The database 230 stores the first three-dimensional information of the SPI apparatus 210 and the second three-dimensional information of the AOI apparatus 220.

The alarm-generating apparatus 240 receives the first three-dimensional information and the second three-dimensional information from the database 230, and generates an alarm is message to modify the first tolerance in case that the second three-dimensional information is beyond the second tolerance. For example, even though the first three-dimensional information is within the first tolerance and thus the solder paste formed on the board is judged as good, in case that the second three-dimensional information is beyond the second tolerance and thus the solder joint, the configuration of the component, etc. is judged as bad after mounting the electronic component, the alarm message may be generated and transferred to the SPI apparatus 210.

A central processing unit or a control unit of the SPI apparatus 210 having received alarm message may modify the first tolerance wider or narrower by a predetermined value, step by step, which may be automatically controlled in the SPI apparatus 210, or may be manually controlled by a user, by displaying modification scope information to the user.

In an exemplary embodiment, the alarm-generating apparatus 240 receives the volume information of the solder paste and the score information of the solder joint from the database 230, and generates an alarm message to modify the first tolerance in case that the score information of the solder joint is beyond the second tolerance.

Thus, the generated alarm message is transferred to the SPI apparatus 210, and the SPI apparatus 210 may set the first tolerance as a scope narrower than a predetermined step by one step lower.

Figure 4:
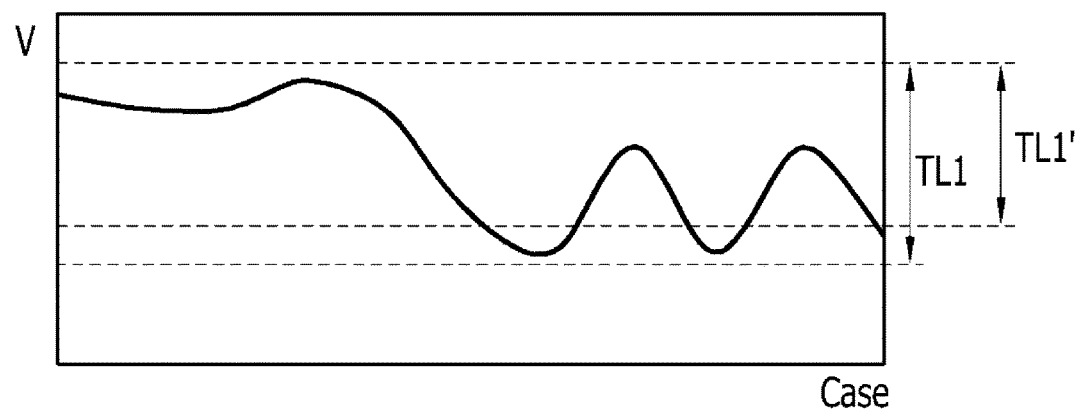
FIGS. 4 and 5 are graphs illustrating an exemplary embodiment of generating an alarm message in the board inspection apparatus system illustrated in FIG. 3.
Figure 5:
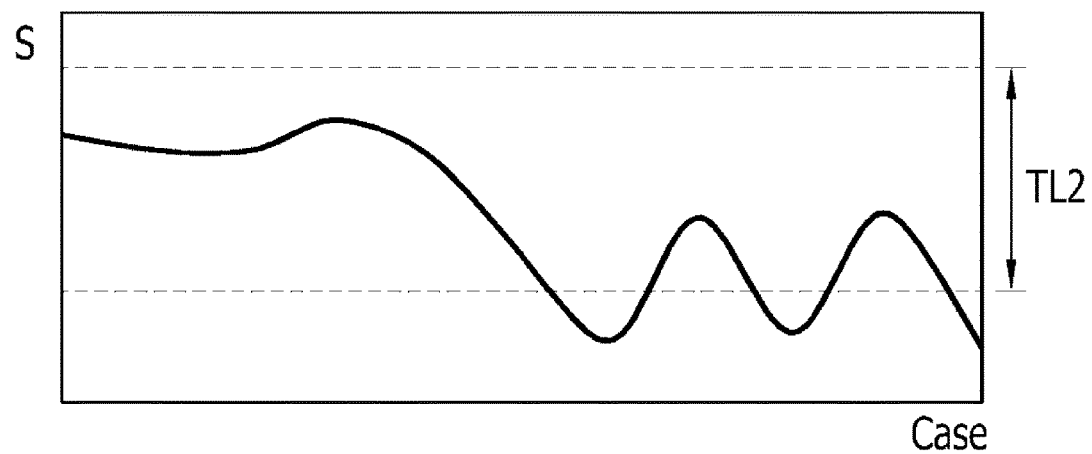

FIGS. 4 and 5 are graphs illustrating an exemplary embodiment of generating an alarm message in the board inspection apparatus system illustrated in FIG. 3.

A vertical axis of a graph in FIG. 4 represents the volume information V of the solder is paste corresponding to the first three-dimensional information, and a vertical axis of a graph in FIG. 5 represents the score information S of the solder joint corresponding to the second three-dimensional information. A horizontal axis of a graph of each of FIGS. 4 and 5 represents various cases.

Particularly, the cases may represent inspection results of various boards for any one of solder pastes or joints corresponding to an electronic component, or represent inspection results of various boards for solder pastes or joints corresponding to an electronic component. Alternatively, the cases may represent inspection results of various boards for an average of solder pastes or joints corresponding to an electronic component.

Referring to FIGS. 4 and 5, although the volumes of the solder paste are within the first tolerance TL1 as a result of inspecting the board by the SPI apparatus 210, the scores of the solder joint are beyond the second tolerance TL2 as a result of inspecting the board by the AOI apparatus 220. Thus, the graphs show that even though the board is judged as good by the SPI apparatus 210, the board may be judged as bad by the AOI apparatus 220. In other words, even though amount of the solder paste is proper and thus the solder paste is judged as good, the shape of the solder joint after mounting the electronic component on the board is improper and thus the electronic component may be judged as bad.

In this case, the alarm-generating apparatus 240 receives the volume information of the solder paste and the score information of the solder joint from the database 230, and generates an alarm message in case that the score information of the solder joint is beyond the second tolerance TL2, and thus the first tolerance TL1 may be modified to a modified-first tolerance TL1' that is narrower than the first tolerance TL1.

As described above, when the first tolerance TL1 is modified to the modified-first tolerance TL1', afterwards, volume of a solder paste on a board is judged as good based on the modified-first tolerance TL1' by the SPI apparatus 210, and the board having the solder paste is moved to the AOI apparatus 220, in which the score information of the solder joint may be included in the second tolerance TL2. Thus, a defective board may be prevented in advance.

Figure 6:
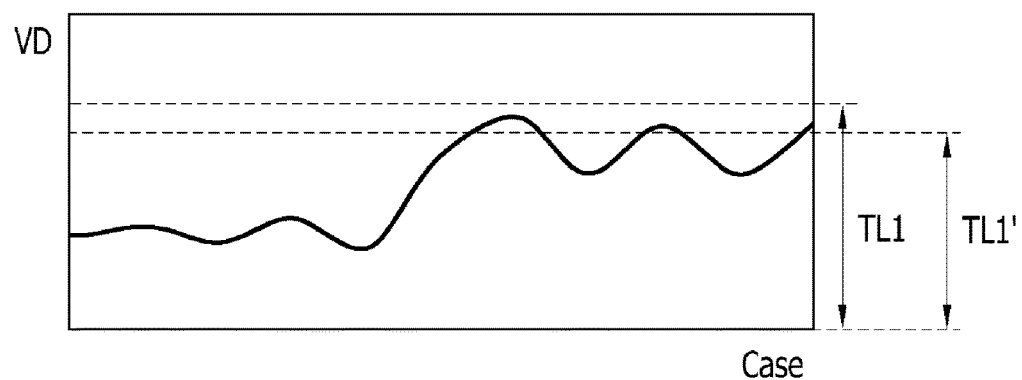
FIGS. 6 and 7 are graphs illustrating another exemplary embodiment of generating an alarm message in the board inspection apparatus system illustrated in FIG. 3.
Figure 7:
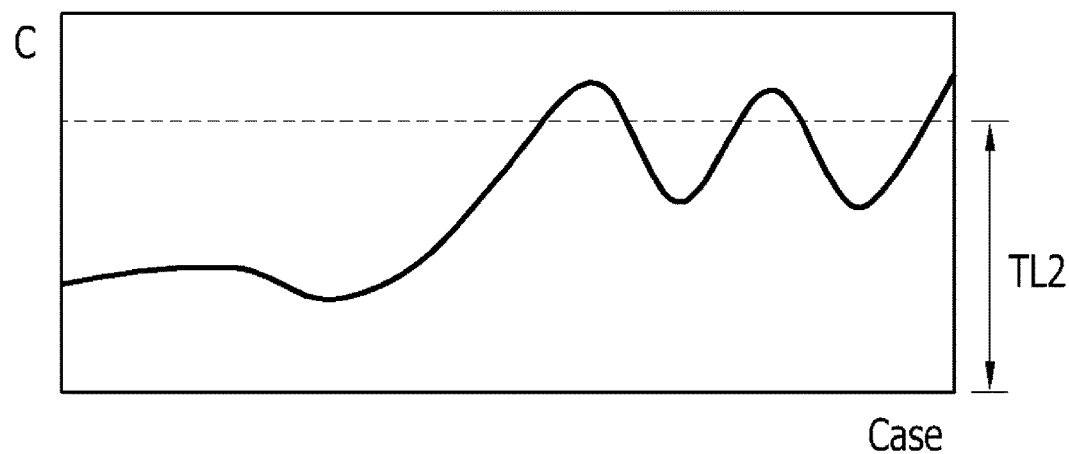

FIGS. 6 and 7 are graphs illustrating another exemplary embodiment of generating an alarm message in the board inspection apparatus system illustrated in FIG. 3.

A vertical axis of a graph in FIG. 6 represents the volume difference information VD of the solder paste, which corresponds to the first three-dimensional information, in case that the solder paste is formed at least two places corresponding to the electronic component, and a vertical axis of a graph in FIG. 7 represents the co-planarity information C of the electronic component, which corresponds to the second three-dimensional information. A horizontal axis of a graph of each of FIGS. 6 and 7 represents various cases.

Particularly, the cases may represent inspection results of various boards for any one of solder pastes or any one of electronic components, or represent inspection results of various boards for solder pastes or electronic components. Alternatively, the cases may represent inspection results of various boards for an average of solder pastes or an average of electronic components.

Referring to FIGS. 6 and 7, although the volume difference of the solder paste between at least two places is within the first tolerance TL1 as a result of inspecting the board by the SPI apparatus 210, the co-planarity of the electronic component is beyond the second tolerance TL2 as a result of inspecting the board by the AOI apparatus 220. Thus, the graphs show that even though the board is judged as good by the SPI apparatus 210, the board may be judged as bad by the AOI apparatus 220. In other words, even though the volume difference of the solder pastes formed on the two places is proper and thus the solder paste is judged as good, the co-planarity after mounting the electronic component on the board is improper and thus the electronic component may be judged as bad.

In this case, the alarm-generating apparatus 240 receives the volume difference information and the co-planarity information from the database 230, and generates an alarm message in case that the co-planarity information is beyond the second tolerance TL2, and thus the first tolerance TL1 may be modified to a modified-first tolerance TL1' that is narrower than the first tolerance TL1.

The modification process may be performed by a predetermined value, step by step. In addition, the modification process may be automatically controlled in the SPI apparatus 210, or may be manually controlled by a user, by providing information to the user.

As described above, when the first tolerance TL1 is modified to the modified-first tolerance TL1', afterwards, volume difference of a solder paste on a board is judged as good based on the modified-first tolerance TL1' by the SPI apparatus 210, and the board having the solder paste is moved to the AOI apparatus 220, in which the co-planarity information may be included in the second tolerance TL2. Thus, a rate of defect may be reduced.

Figure 8:
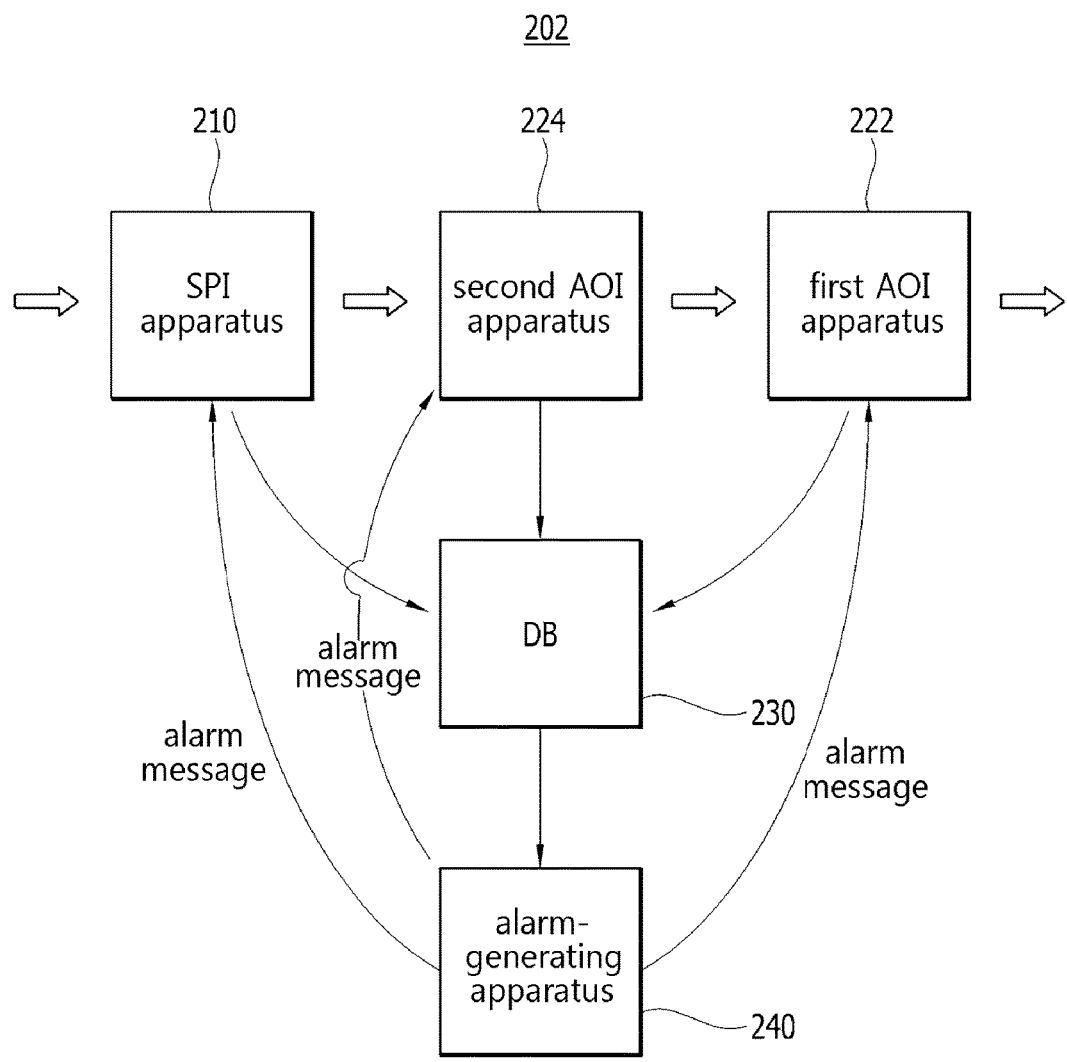
FIG. 8 is a block diagram illustrating a board inspection apparatus system according to still another exemplary embodiment of the present invention.

FIG. 8 is a block diagram illustrating a board inspection apparatus system according to still another exemplary embodiment of the present invention.

Referring to FIG. 8, a board inspection apparatus system 202 according to still another is exemplary embodiment of the present invention may include an SPI apparatus 210, a first AOI apparatus 222, a second AOI apparatus 224, a database 230, an alarm-generating apparatus 240, etc.

The board inspection apparatus system 202 illustrated in FIG. 8 may further include the second AOI apparatus 224 for additionally inspecting whether the board is good or bad after mounting an electronic component and before performing a reflow process.

Particularly, the board inspection apparatus system 202 receives a board, for example, such as a printed circuit board (PCB), and inspects whether the board is good or bad. The board inspection apparatus system 202 performs a first inspection by inspecting whether a solder paste is formed good using the SPI apparatus 210, after receiving the board. Then, an electronic component is mounted on the board having the solder paste formed thereon, and thereafter, the board inspection apparatus system 202 performs a second inspection by inspecting whether the electronic component is formed good on the solder paste using the second AOI apparatus 224.

Then, the solder paste formed on the board is fused through a reflow process using, for example, a reflow equipment, to thereby install the electronic component on the board. After installing the electronic component on the board, the board inspection apparatus system 202 performs a third inspection by inspecting whether the electronic component is formed good on the board using the first AOI apparatus 222

As described above, the second AOI apparatus 224 may be disposed at the foregoing part of the reflow process to inspect the board. The first and second AOI apparatuses 222 and 224 may be employed by disposing substantially the same apparatus at each of the foregoing part and the following part of the reflow process, and alternatively the same apparatus may be is repetitively used at the foregoing part and the following part of the reflow process by controlling flow of the board.

A block arrow shown in FIG. 8 indicates a flow of the board via the SPI apparatus 210, the first AOI apparatus 222 and the second AOI apparatus 224.

Hereinafter, the board inspection apparatus system 202 will be described in detail.

The SPI apparatus 210 acquires first three-dimensional information of a solder paste formed on a board, and inspects whether the solder paste is formed good or bad by a first tolerance based on the first three-dimensional information. The SPI apparatus 210 is substantially the same as the SPI apparatus 110 illustrated in FIGS. 1 and 2. Thus, any further description will be omitted.

The first three-dimensional information may include offset information of the solder paste which represents a degree by which the solder paste deviates from a location at which the solder paste is prearranged to be formed. Alternatively, the first three-dimensional information may be just location information of the solder paste at which the solder paste is formed. The offset information of the solder paste and the location information of the solder paste may be obtained from shape information of the solder paste.

The first AOI apparatus 222 acquires second three-dimensional information for inspecting whether the electronic component, which is mounted on the board having the solder paste formed thereon, is mounted good or bad, and the second three-dimensional information is measured after performing the reflow process. The first AOI apparatus 222 inspects whether the electronic component is mounted good or bad by a predetermined second tolerance based on the second three-dimensional information. The first AOI apparatus 222 is substantially the same as is the AOI apparatus 220 illustrated in FIG. 3. Thus, any further description will be omitted.

The second three-dimensional information may include post-offset information of the electronic component which represents a degree by which the electronic component deviates from a location at which the electronic component is prearranged to be mounted after the reflow process is performed. Alternatively, the second three-dimensional information may be just post-location information of the electronic component at which the electronic component is mounted. The post-offset information of the electronic component or the post-location information of the electronic component may be obtained from shape information of the electronic component (for example, pre-received computer aided design (CAD) data, electronic component mounting information transferred from the electronic component mounting apparatus, etc.)

The second AOI apparatus 224 acquires third three-dimensional information that is measured before performing the reflow process in the condition that electronic component is disposed on the board having the solder paste formed thereon, and inspects whether the electronic component is mounted good or bad by a predetermined third tolerance based on the third three-dimensional information. Substantially the same apparatus as the first AOI 222 apparatus may be employed as the second AOI apparatus 224.

The third three-dimensional information may include pre-offset information of the electronic component which represents a degree by which the electronic component deviates from a location at which the electronic component is prearranged to be mounted after the electronic component is mounted and before the reflow process is performed. Alternatively, the third three-dimensional information may be just pre-location information of the electronic component at which the electronic component is mounted. The pre-offset information of the is electronic component or the pre-location information of the electronic component may be obtained from shape information of the electronic component (for example, pre-received computer aided design (CAD) data, electronic component mounting information transferred from the electronic component mounting apparatus, etc.)

The database 230 stores the first three-dimensional information of the SPI apparatus 210, the second three-dimensional information of the first AOI apparatus 222 and the third three-dimensional information of the second AOI apparatus 224.

The alarm-generating apparatus 240 receives the first three-dimensional information, the second three-dimensional information and the third three-dimensional information from the database 230. In case that one information of the first, second and third three-dimensional information is beyond a predetermined tolerance, the alarm-generating apparatus 240 generates an alarm message to modify at least one tolerance of the other information.

In an exemplary embodiment, the alarm-generating apparatus 240 may generate an alarm message to modify the first tolerance in case that the third three-dimensional information is beyond the third tolerance, and transfer the alarm message to the SPI apparatus 210.

For example, even though the first three-dimensional information is within the first tolerance and thus the formation of the solder paste is judged as good, in case that the third three-dimensional information is beyond the third tolerance and thus the mounting state of the electronic component before the reflow process is judged as bad, the alarm message is generated to provide information to the SPI apparatus 210 and a user of the SPI apparatus 210 so as to modify the first tolerance to become narrower.

In an exemplary embodiment, the alarm-generating apparatus 240 may receive the offset information of the solder paste and the pre-offset information of the electronic component before the reflow process from the database 230, and generate an alarm message to modify the first tolerance in case that the pre-offset information of the electronic component is beyond the third tolerance.

Alternatively, the alarm-generating apparatus 240 may generate an alarm message to modify the third tolerance in case that the second three-dimensional information is beyond the second tolerance.

For example, even though the third three-dimensional information is within the third tolerance and thus the mounting state of the electronic component before the reflow process is judged as good, in case that the second three-dimensional information is beyond the second tolerance and thus the mounting state of the electronic component after the reflow process is judged as bad, the alarm message is generated to provide information to the second AOI apparatus 224 and a user of the second AOI apparatus 224 so as to modify the third tolerance to become narrower.

In an exemplary embodiment, the alarm-generating apparatus 240 may receive the pre-offset information of the electronic component before the reflow process and the post-offset information of the electronic component after the reflow process from the database 230, and generate an alarm message to modify the third tolerance in case that the post-offset information of the electronic component is beyond the second tolerance.

Figure 9:
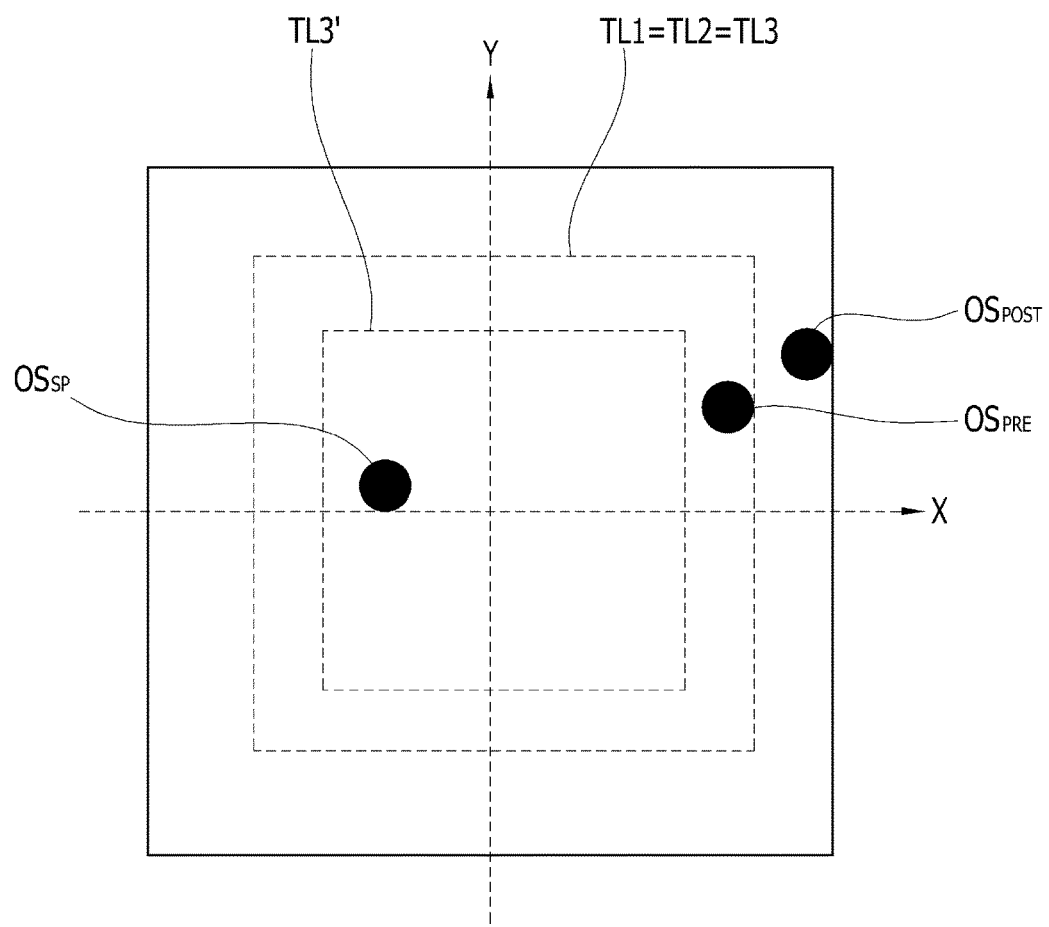
FIG. 9 is a schematic view illustrating an exemplary embodiment of generating an alarm message in the board inspection apparatus system illustrated in FIG. 8.

FIG. 9 is a schematic view illustrating an exemplary embodiment of generating an alarm message in the board inspection apparatus system illustrated in FIG. 8.

In FIG. 9, the X-Y coordinates system represents an offset, and the origin represents the case that the solder paste or the electronic component is not warped at all. In FIG. 9, in an exemplary embodiment, a first tolerance TL1, a second tolerance TL2 and a third tolerance TL3 are the same.

Referring to FIG. 9, although an offset $OS_{SP}$ of a solder paste and a pre-offset $OS_{PRE}$ of an electronic component are within the first tolerance TL1 and the third tolerance TL3, respectively, as a result of inspecting a board by the SPI apparatus 210 and the second AOI apparatus 224, a post-offset $OS_{POST}$ of the electronic component is beyond the second tolerance TL2 as a result of inspecting the board by the first AOI apparatus 222.

Thus, FIG. 9 shows that even the board that is judged as good by the SPI apparatus 210 and the second AOI apparatus 224 may be judged as bad by the first AOI apparatus 222. In other words, even though the formed location of the solder paste and the mounted location of the electronic component are proper and thus the mounting of the electronic component before forming the solder paste and performing the reflow process is judged as good, the shape of the electronic component after the reflow process is improper and thus the mounting the electronic component may be judged as bad.

In this case, the alarm-generating apparatus 240 receives the pre-offset $OS_{PRE}$ information of the electronic component and the post-offset $OS_{POST}$ information of the electronic component from the database 230, and generates and transfers an alarm message to the second AOI apparatus 224 in case that the post-offset $OS_{POST}$ information of the electronic component is beyond the second tolerance TL2. Thus, the third tolerance TL3 may be modified to a modified-third tolerance TL3' that is narrower than the third tolerance TL3.

The modification process may be performed by a predetermined value, step by step. In addition, the modification process may be automatically controlled in the second AOI apparatus 224, or may be manually controlled by a user, by providing information to the user.

As described above, when the third tolerance TL3 is modified to the modified-third tolerance TL3', appearance of a defect board may be prevented in advance.

According to the board inspection apparatus system, three-dimensional information is acquired in each of an SPI apparatus and an AOI apparatus, and the acquired three-dimensional information is exchanged to each other, thereby sharing inspection results between the SPI apparatus and the AOI apparatus.

Particularly, three-dimensional information of a solder paste and three-dimensional information of a solder joint is acquired in the SPI apparatus and the AOI apparatus, respectively, and the acquired three-dimensional information is exchanged to each other, to use one inspection result to another inspection, thereby modifying inspection condition of the two apparatuses effective.

In addition, three-dimensional measurement results of the SPI apparatus and the AOI apparatus are stored in a database, and an alarm-generating apparatus receives three-dimensional information from the database and in case that one inspection result is beyond a tolerance, generates an alarm message to another inspection, thereby automatically or manually modifying inspection condition more effective.

In other words, information of inspection result that is acquired in an SPI apparatus and an AOI apparatus is exchanged to each other through a linkage between the two apparatuses, and is thus flexible control of narrowing or widening a tolerance with respect to defect, which is established in each apparatus, is performed, thereby greatly reducing various pseudo-errors (i.e., errors of judging a good board as a bad board) that may occur in SPI inspection and AOI inspection.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A board inspection apparatus system comprising:
   a solder paste inspection (SPI) apparatus acquiring first three-dimensional information of a solder paste formed on a board, and using a predetermined first tolerance to inspect the solder paste;
   an automated optical inspection (AOI) apparatus acquiring second three-dimensional information of an electronic component that is mounted on the board having the solder paste formed thereon, and using a predetermined second tolerance to inspect the electronic component;
   a database storing the first three-dimensional information received from the SPI apparatus and the second three-dimensional information received from the AOI apparatus; and
   an alarm-generating apparatus receiving the first three-dimensional information and the second three-dimensional information from the database, determining whether the second three-dimensional information is beyond the predetermined second tolerance, generating an alarm message in case that the second three-dimensional information is beyond the predetermined second tolerance, and transferring the alarm message to the SPI apparatus,
   wherein the first three-dimensional information includes volume information of the solder paste, and the second three-dimensional information includes score information of a solder joint quantifying joint degree between the solder paste and the electronic component,
   wherein the joint degree represents how much a lead of the electronic component is joined to the solder paste,
   wherein the alarm-generating apparatus receives the volume information of the solder paste and the score information of the solder joint from the database, and generates the alarm message to modify the predetermined first tolerance in case that the score information of the solder joint is beyond the predetermined second tolerance,
   wherein the SPI apparatus receives the alarm message from the alarm-generating apparatus, modifies the predetermined first tolerance to a modified tolerance based on the alarm message received from the alarm-generating apparatus, and uses the modified tolerance to inspect another solder paste formed on another board,
   wherein the modified tolerance is used only for inspecting the another solder paste formed on the another board, and
   wherein the SPI apparatus uses the modified tolerance to inspect the another solder paste on the another board by acquiring another first three-dimensional information of the another solder paste formed on the another board, and comparing the another first three-dimensional information with the modified tolerance to reduce pseudo-errors that occur in SPI inspection when inspecting the solder paste and AOI inspection when inspecting the electronic component.

2. A board inspection apparatus system comprising:

a solder paste inspection (SPI) apparatus acquiring first three-dimensional information of a solder paste formed on a board, and using a predetermined first tolerance to inspect the solder paste;

an automated optical inspection (AOI) apparatus acquiring second three-dimensional information of an electronic component that is mounted on the board having the solder paste formed thereon, and using a predetermined second tolerance to inspect the electronic component;

a database storing the first three-dimensional information received from the SPI apparatus and the second three-dimensional information received from the AOI apparatus; and an alarm-generating apparatus receiving the first three-dimensional information and the second three-dimensional information from the database, determining whether the second three-dimensional information is beyond the predetermined second tolerance, generating an alarm message in case that the second three-dimensional information is beyond the predetermined second tolerance, and transferring the alarm message to the SP apparatus, wherein the solder paste is formed at least two places corresponding to the electronic component, wherein the first three-dimensional information includes volume difference information representing a difference between volumes of the solder paste at the two places, and the second three-dimensional information includes co-planarity information representing a degree by which the electronic component is inclined to horizontality, wherein the co-planarity information includes information of a height difference between the two places, wherein the alarm-generating apparatus receives the volume difference information and the co-planarity information from the database, and generates the alarm message to modify the predetermined first tolerance in case that the co-planarity information is beyond the predetermined second tolerance, wherein the SPI apparatus receives the alarm message from the alarm-generating apparatus, modifies the predetermined first tolerance to a modified tolerance based on the alarm message received from the alarm-generating apparatus, and uses the modified tolerance to inspect another solder paste formed on another board, wherein tyre modified tolerance is used only for inspecting the another solder paste formed on the another board, and wherein the SPI apparatus uses the modified tolerance to inspect the another solder paste on the another board acquiring another first three-dimensional information of the another solder paste formed on the another board, and comparing the another first three-dimensional information with the modified tolerance to reduce pseudo-errors that occur in SPI inspection when inspecting the solder paste and AOI inspection when inspecting the electronic component.

3. The board inspection apparatus system of claim 1, wherein the AOI apparatus acquires third three-dimensional information for inspecting defectiveness in the electronic component that is disposed on the board after the electronic component is disposed on the board and before a reflow process, has a predetermined third tolerance and inspects defectiveness in the electronic component based on the third three-dimensional information and the predetermined third tolerance, wherein the database stores the third three-dimensional information received from the AOI apparatus, and wherein the alarm-generating apparatus receives the second three-dimensional information and the third three-dimensional information from the database, and generates an alarm message to transfer to the AOI apparatus in case that the second three-dimensional information is beyond the predetermined second tolerance.

4. A board inspection apparatus system comprising:

a solder paste inspection (SPI) apparatus acquiring first three-dimensional information of a solder paste formed on a board, and using a predetermined first tolerance to inspect the solder paste;

a first automated optical inspection (AOI) apparatus acquiring second three-dimensional information for mounting state of an electronic component after a reflow process, and using a predetermined second tolerance to inspect the electronic component that is mounted on the board;

a second AOI apparatus acquiring third three-dimensional information for mounting state of the electronic component before the reflow process, and using a predetermined third tolerance to inspect the electronic component;

a database storing the first three-dimensional information received from the SPI apparatus and the second and third three-dimensional information received from the first and second AOI apparatuses; and an alarm-generating apparatus receiving the first three-dimensional information, the second three-dimensional information and the third three-dimensional information from the database, determining whether one information of the first, second and third three-dimensional information is beyond respectively the predetermined first, second and third tolerance, and generating an alarm message in case that the one information of the first, second and third three-dimensional information is beyond respectively the predetermined first, second and third tolerance, and transferring the alarm message to at least one of the SPI apparatus, the first AOI apparatus and the second AOI apparatus corresponding to at least one of the first, second and third three-dimensional information other than the one information, wherein the first three-dimensional information includes offset information of the solder paste which represents a degree by which the solder paste deviates from a location at which the solder paste is prearranged to be formed, and the third three-dimensional information includes pre-offset information of the electronic component which represents a degree by which the electronic component deviates from a location at which the electronic component is prearranged to be mounted after the electronic component is mounted and before reflow process is performed, wherein the alarm-generating apparatus receives the offset information and the pre-offset information from the database, and generates an alarm message to modify the predetermined first tolerance in case that the pre-offset information is beyond the predetermined third tolerance, wherein the SPI apparatus receives the alarm message from the alarm-generating apparatus, modifies the predetermined first tolerance to a modified tolerance based on the alarm message received from the alarm-generating apparatus, and uses the modified tolerance to inspect another solder paste formed on another board, wherein the modified tolerance is used only for inspecting the another solder paste formed on the another board, and wherein the SPI apparatus uses the modified tolerance to inspect the another solder paste on the another board by acquiring another first three-dimensional information of the another solder paste formed on the another board, and comparing the another first three-dimensional information with the modified tolerance to reduce pseudo-errors that occur in SPI inspection when inspecting the solder paste and AOI inspection when inspecting the electronic component.

5. A board inspection apparatus system comprising:

a solder paste inspection (SPI) apparatus acquiring first three-dimensional information of a solder paste formed on a board, and using a predetermined first tolerance to inspect the solder paste;

a first automated optical inspection (AOI) apparatus acquiring second three-dimensional information for mounting state of an electronic component after a reflow process, and using a predetermined second tolerance to inspect the electronic component that is mounted on the board;

a second AOI apparatus acquiring third three-dimensional information for mounting state of the electronic component before the reflow process, and using a predetermined third tolerance to inspect the electronic component;

a database storing the first three-dimensional information received from the SPI apparatus and the second and third three-dimensional information received from the first and second AOI apparatuses; and an alarm-generating apparatus receiving the first three-dimensional information, the second three-dimensional information and the third three-dimensional information from the database, determining whether one information of the first, second and third three-dimensional information is beyond respectively the predetermined first, second and third tolerance, and generating an alarm message in case that the one information of the first, second and third three-dimensional information is beyond respectively the predetermined first, second and third tolerance, and transferring the alarm message to at least one of the SPI apparatus, the first AOI apparatus and the second AOI apparatus corresponding to at least one of the first, second and third three-dimensional information other than the one information, wherein the second three-dimensional information includes post-offset information of the electronic component which represents a degree by which the electronic component deviates from a location at which the electronic component is prearranged to be mounted after the reflow process is performed, and the third three-dimensional information includes pre-offset information of the electronic component which represents a degree by which the electronic component deviates from a location at which the electronic component is prearranged to be mounted after the electronic component is mounted and before the reflow process is performed, wherein the alarm-generating apparatus receives the pre-offset information and the post-offset information from the database, and generates an alarm message to modify the predetermined third tolerance in case that the post-offset information is beyond the predetermined second tolerance, wherein the second AOI apparatus receives the alarm message from the alarm-generating apparatus, modifies the predetermined third tolerance to a modified tolerance based on the alarm message received from the alarm-generating apparatus, and uses the modified tolerance to inspect another electronic component mounted on another board, wherein the modified tolerance is used only for inspecting the another electronic component mounted on the another board, and wherein the second AOI apparatus uses the modified tolerance to inspect the another electronic component mounted on the another board by acquiring another third three-dimensional information for mounting state of another electronic component mounted on the another board before a reflow process, and comparing the another third three-dimensional information with the modified tolerance to reduce pseudo-errors that occur in SPI inspection when inspecting the solder paste and AOI inspection when inspecting the electronic component.

* * * * *